(12) United States Patent
Dolechek

(10) Patent No.: US 6,732,945 B2
(45) Date of Patent: May 11, 2004

(54) CHEMICAL SOLUTIONS METHODS FOR PROCESSING SEMICONDUCTOR MATERIALS

(75) Inventor: Kert Dolechek, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/205,776

(22) Filed: Jul. 26, 2002

(65) Prior Publication Data

US 2002/0185549 A1 Dec. 12, 2002

Related U.S. Application Data

(62) Division of application No. 09/609,879, filed on Jul. 5, 2000, now Pat. No. 6,446,644.
(60) Provisional application No. 60/142,740, filed on Jul. 6, 1999.

(51) Int. Cl.[7] ............................................... A01G 25/00
(52) U.S. Cl. ........................... 239/65; 239/63; 239/135; 222/64; 222/71; 141/95; 134/57 R
(58) Field of Search ........................... 239/65, 63, 135; 22/1, 59, 61, 64, 71, 135; 141/302, 95; 137/411, 392; 134/57 R

(56) References Cited

U.S. PATENT DOCUMENTS

| | | | | | |
|---|---|---|---|---|---|
| 4,317,475 A | * | 3/1982 | Miller et al. | ................. | 141/302 |
| 4,398,836 A | * | 8/1983 | Sitek | ............................ | 374/38 |
| 4,557,301 A | * | 12/1985 | Jorss | ........................... | 141/302 |
| 5,246,023 A | * | 9/1993 | Breunsbach et al. | ....... | 134/57 R |
| 5,450,882 A | * | 9/1995 | Cragun | ........................ | 141/95 |
| 5,490,611 A | * | 2/1996 | Bernosky et al. | .............. | 222/64 |
| 5,896,900 A | * | 4/1999 | Haring et al. | ................. | 141/95 |
| 6,279,622 B1 | * | 8/2001 | Nguyen et al. | ................ | 141/65 |

* cited by examiner

*Primary Examiner*—Dinh Q. Nguyen
(74) *Attorney, Agent, or Firm*—Perkins Coie LLP

(57) ABSTRACT

A semiconductor processing system has a liquid chemical metering and delivery system including a process tank and a metering vessel. Fluid level detectors detect the fluid level in the process tank and metering vessel. A two stage fill valve fills the metering vessel from bottom to top. A dispense valve dispenses the metered contents of the vessel into a process tank via gravity, to form a chemical solution in the process tank, with high mixing accuracy. The volumes of the metering vessel and process tank and the inflow and outflow rates are set to provide 100% up time to a process chamber which uses the chemical solution to process semiconductor wafers or other flat media.

16 Claims, 9 Drawing Sheets

CHEMICAL SOLUTIONS METHODS FOR PROCESSING SEMICONDUCTOR MATERIALS

This Application is a Divisional of U.S. patent application Ser. No. 09/609,879, filed Jul. 5, 2000, now U.S. Pat. No. 6,446,644, which claims priority to U.S. Provisional Patent Application Ser. No. 60/142,740, filed Jul. 6, 1999.

FIELD OF THE INVENTION

The field of the invention is automated processing systems used for processing semiconductor wafers, hard disk media, substrates, and similar flat media.

BACKGROUND OF THE INVENTION

Electronic products, for example, computers, televisions, telephones, etc., contain large numbers of electronic semiconductor devices. To produce these electronic products, hundreds or thousands of semiconductor devices are manufactured in a very small space, using lithography techniques on semiconductor substrates, such as on silicon wafers. A large number of individual processing steps may be required to manufacture the semiconductor devices. Various machines and methods have been developed to manufacture semiconductor devices. For example, U.S. Pat. No. 6,279,724, incorporated herein by reference, describes a system having processing chambers for processing and cleaning flat media, referred to herein as "wafers".

In various processing steps, it is necessary to apply or spray different chemical solutions onto the wafers. The chemical solutions, which can contain several different liquid ingredients, must be prepared with precise amounts of the ingredients, to maintain uniform processing of the wafers. Typical wafer processing systems have several processing chambers, with at least one chemical solution process tank associated with each process chamber, for storing the chemical solution used in the process chamber. A chemical solution handling or delivery system associated with each process tank and process chamber, mixes, stores, heats, recirculates, and delivers the chemical solutions to the process chamber.

Wafer throughput is a critical performance parameter for semiconductor processing equipment. To achieve maximum wafer throughput, the chemical process chamber (CPC) must operate at 100% availability. In other words, the CPC must be able to operate when needed, without delays required for preparing the chemical solutions. In processing where several chemical solutions are used sequentially, each chemical solution must be available to the CPC in sequence at the required time, without delays, to operate at 100% availability. Each process step within the CPC takes a specific amount of time. In addition, each chemical solution has a specific bath life, (e.g., 4 hours), and beyond which the chemical solution looses its ability to further adequately process wafers, and it must therefore then be discarded. For maximum throughput, the chemical process tank must thereafter be replenished with fresh chemical solution, within a time less than the sum of the process times of all of the other process steps.

For each process step, the chemical solution accuracy, and temperature stability of the chemical solution, greatly affects the wafer processing rate and wafer processing uniformity. Preferably, chemical solution accuracy is maintained to within 1%, and chemical solution temperature is maintained to a tolerance of plus or minus 1° C. of the temperature set point. However, these design goals have been difficult or impossible to meet.

The chemical solutions used in semiconductor processing can be costly. In addition, handling and disposal of some of these types of chemical solutions can also be costly and time consuming. It is therefore advantageous to use the least amount of chemical solution as possible, while maintaining a desired wafer processing rate, consistency, and quality.

In the past, wafer processing systems, such as described in U.S. Pat. No. 5,664,337, incorporated herein by reference, have used relatively large (e.g., 12 gallon) process tanks. These large tanks have required in excess of 16 minutes to heat the chemical solutions from room temperature to a temperature set point of 70° C. The chemical solution handling or delivery system in these known wafer processors also measure out the chemical solutions in a mixture using a metering pump. As metering pumps have a known error per stroke that accumulates as a volume of chemical solution is delivered, chemical solution accuracy has not been tightly controlled. Use of the metering pump also results in a more complex design, which can impair reliability and increase cost of manufacture.

Accordingly, it is an object of the invention to provide an improved system for handling and delivering chemical solutions in a semiconductor processing system. Other features and advantages will appear hereinafter.

SUMMARY OF THE INVENTION

To these ends, in a first aspect of the invention, a system for delivering a chemical solution to a processing chamber includes a metering vessel and a process tank. Level detectors in the metering vessel and process tank detect liquid levels. A dispense valve on the metering vessel allows the liquid chemical solution component to flow from the metering vessel into the process tank, preferably via gravity. Metering errors accumulating from use of a metering pump are eliminated.

In a second and separate aspect of the invention, the metering vessel has a two stage fill valve assembly, including a first or fast fill valve, and a second or slow fill valve. The first fill valve and the second fill valve both open to rapidly fill the metering vessel to near full. The second valve then closes to restrict flow through a smaller orifice, so the metering vessel continues to fill but at a slower rate, until the metering vessel is full. The metering vessel is quickly filled with a precise volume of liquid.

In a third and separate aspect of the invention, the metering vessel is filled from the bottom, to provide more accurate metering.

In a fourth and separate aspect of the invention, the metering vessel, valves, and other connections and components are supported on a lid of the tank. The process tank can then be removed from the system without disconnecting the various plumbing lines.

BRIEF DESCRIPTION OF THE DRAWINGS

In the drawings, wherein the same reference number indicates the same element, in all of the views.

DETAILED DESCRIPTION OF THE DRAWINGS

Figure 5:
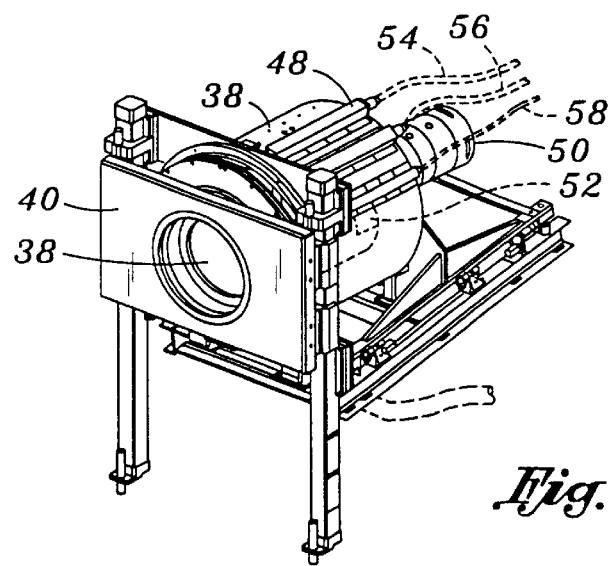
FIG. 5 is a perspective view of one of the processors shown in FIG. 4.

Turning now in detail to the drawings, as shown in FIGS. 1–4, a semiconductor wafer processing system 30 contains a processor unit 32, optionally along with other units, within an enclosure 34. The processor unit 32 has two side by side processors 36. Each processor 36 includes a chemical process chamber or "bowl" 38 accessed via a door 40. A robot 42 within the enclosure 34 moves wafers 44 between a storage section 46 and the chambers 38 of the processors 36. Turning to FIG. 5, each process chamber 38 has spray manifolds 48 which spray chemical solutions, deionized water, or other fluids, onto the wafers 44 held within a rotor 52. A motor 50 spins the rotor 52 within the chamber 38, all as is well known in semiconductor processing technology.

Figure 1:
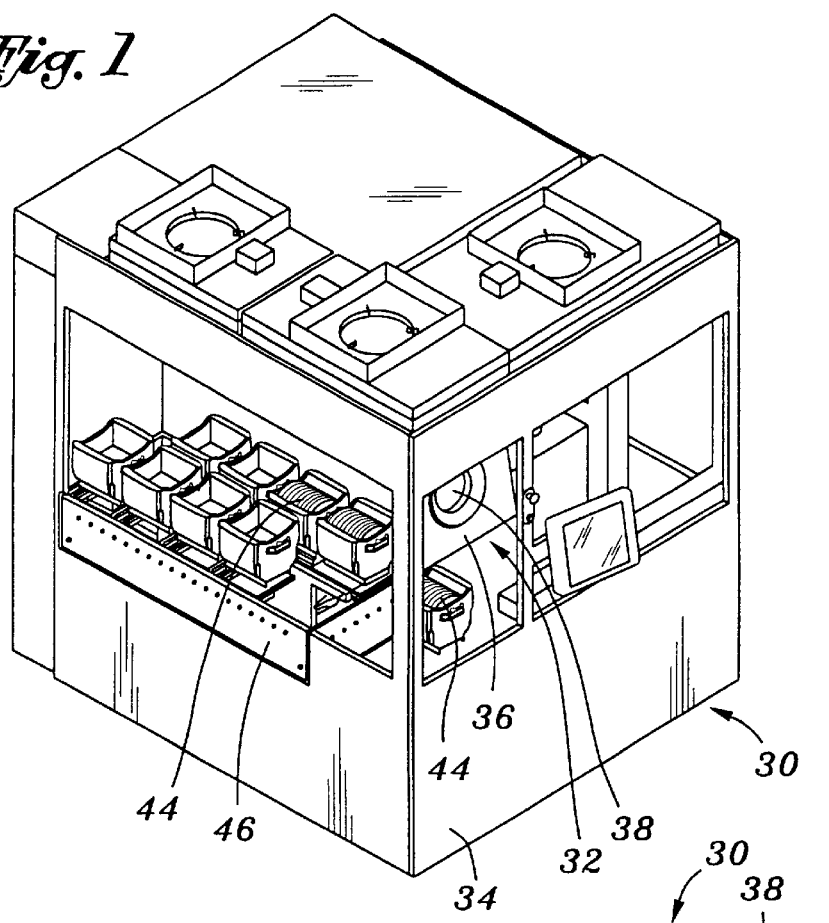
FIG. 1 is a perspective view of a semiconductor wafer processing system.
Figure 2:
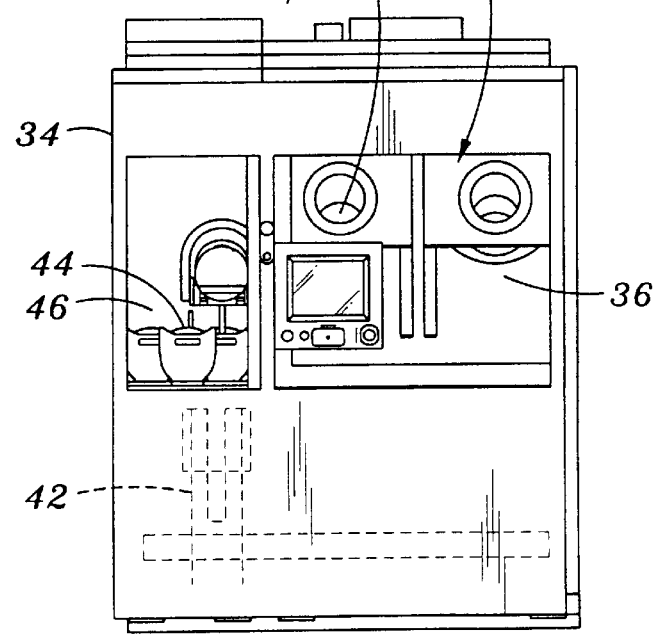
FIG. 2 is a front view of the semiconductor wafer processing system shown in FIG. 1.
Figure 3:
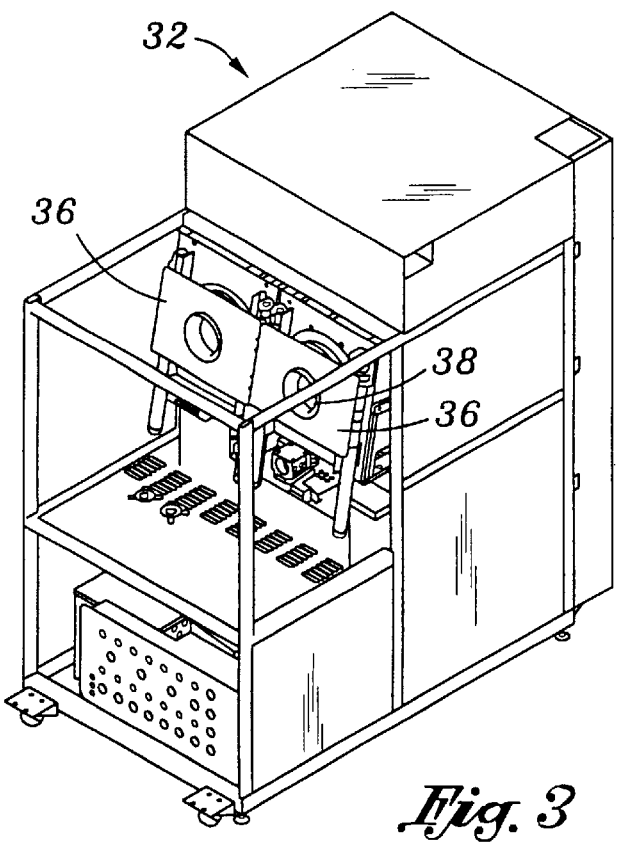
FIG. 3 is a perspective view of a processor unit having two side by side processors.
Figure 4:
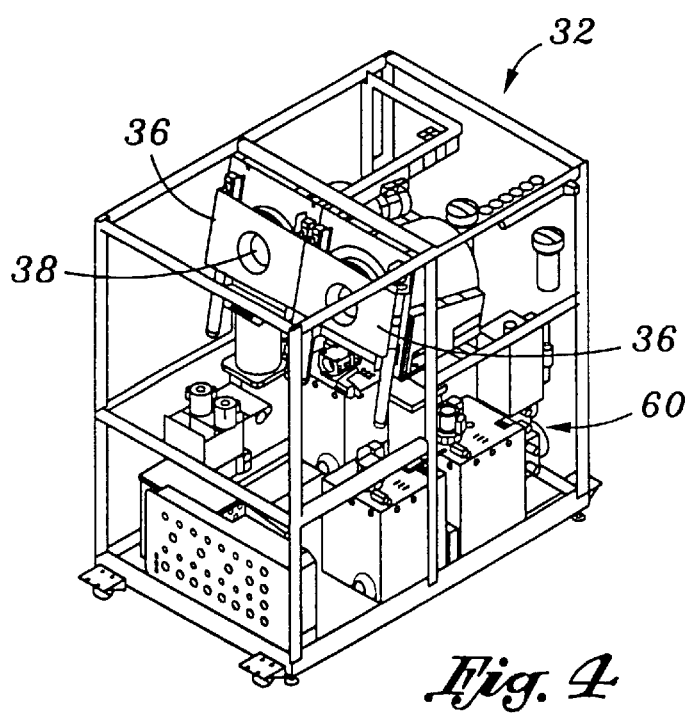
FIG. 4 is a perspective view of the processor unit shown in FIG. 3, with covers removed to show internal components.
Figure 6:
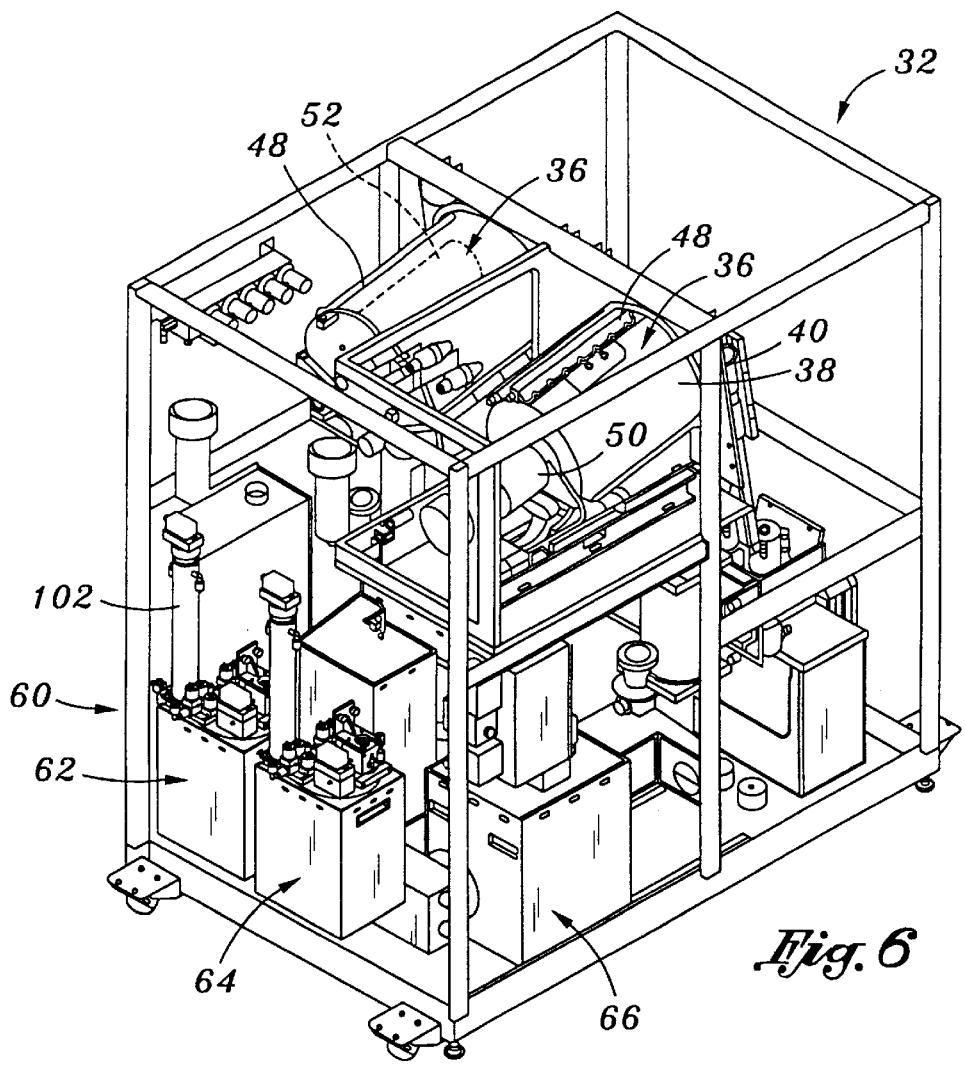
FIG. 6 is a top and back perspective view of the processor unit shown in FIG. 4.

Turning to FIG. 6, the processor unit 32 has a chemical solution supply system 60 below the processors 36. In the embodiment shown, there are four separate chemical solution systems 62, 64 66 and 68, as the chemical solution supply system 60 is set up to have the processors 36 perform a four-chemical cleaning operation on the wafers 44. As is well known in wafer processing, the chemical solutions used for this process are Piranha; DHF; SC1 and SC2.

Figure 15:
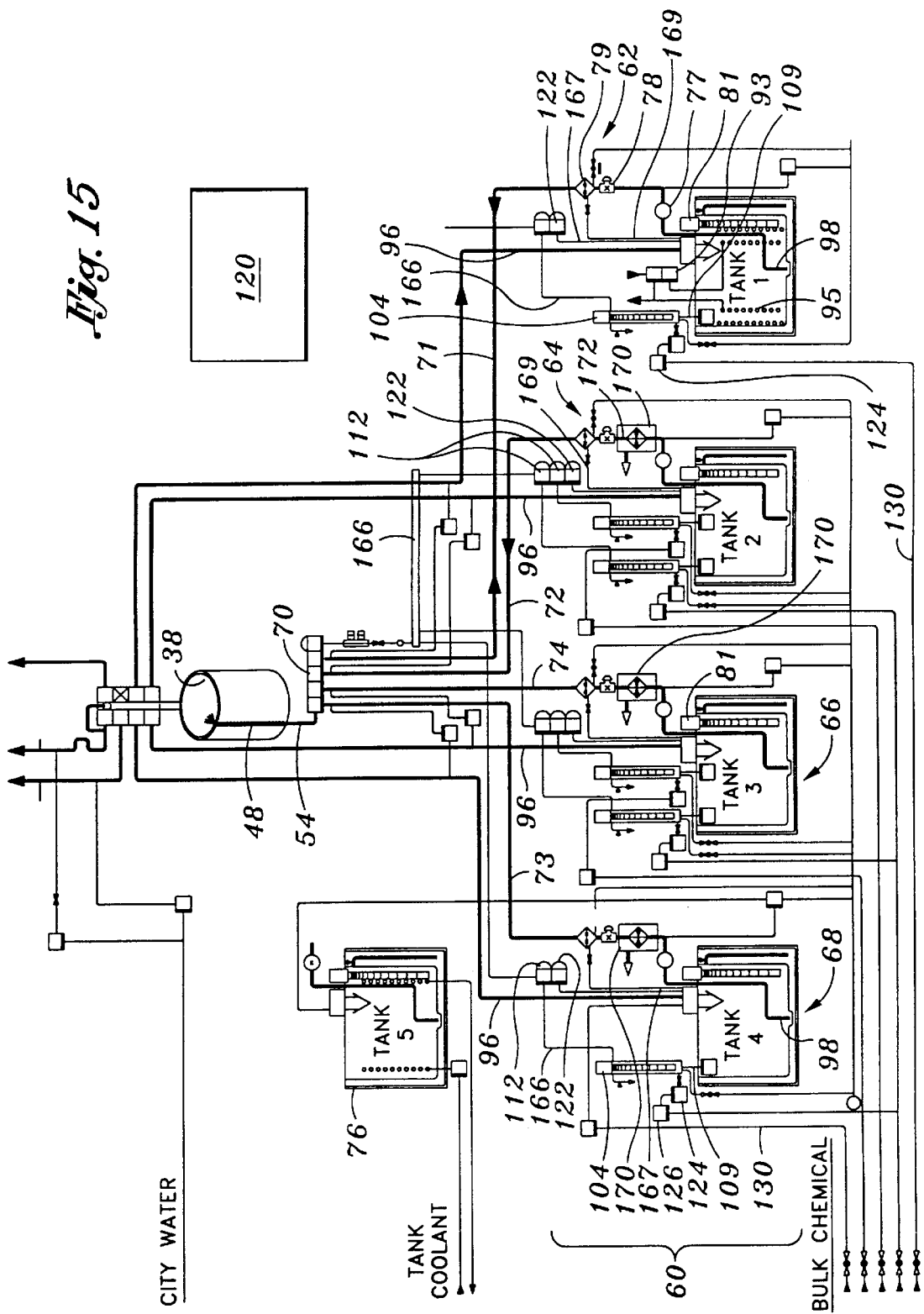
FIG. 15 is a schematic illustration of the interconnections of the four chemical solution systems shown in FIG. 6.
Figure 16:
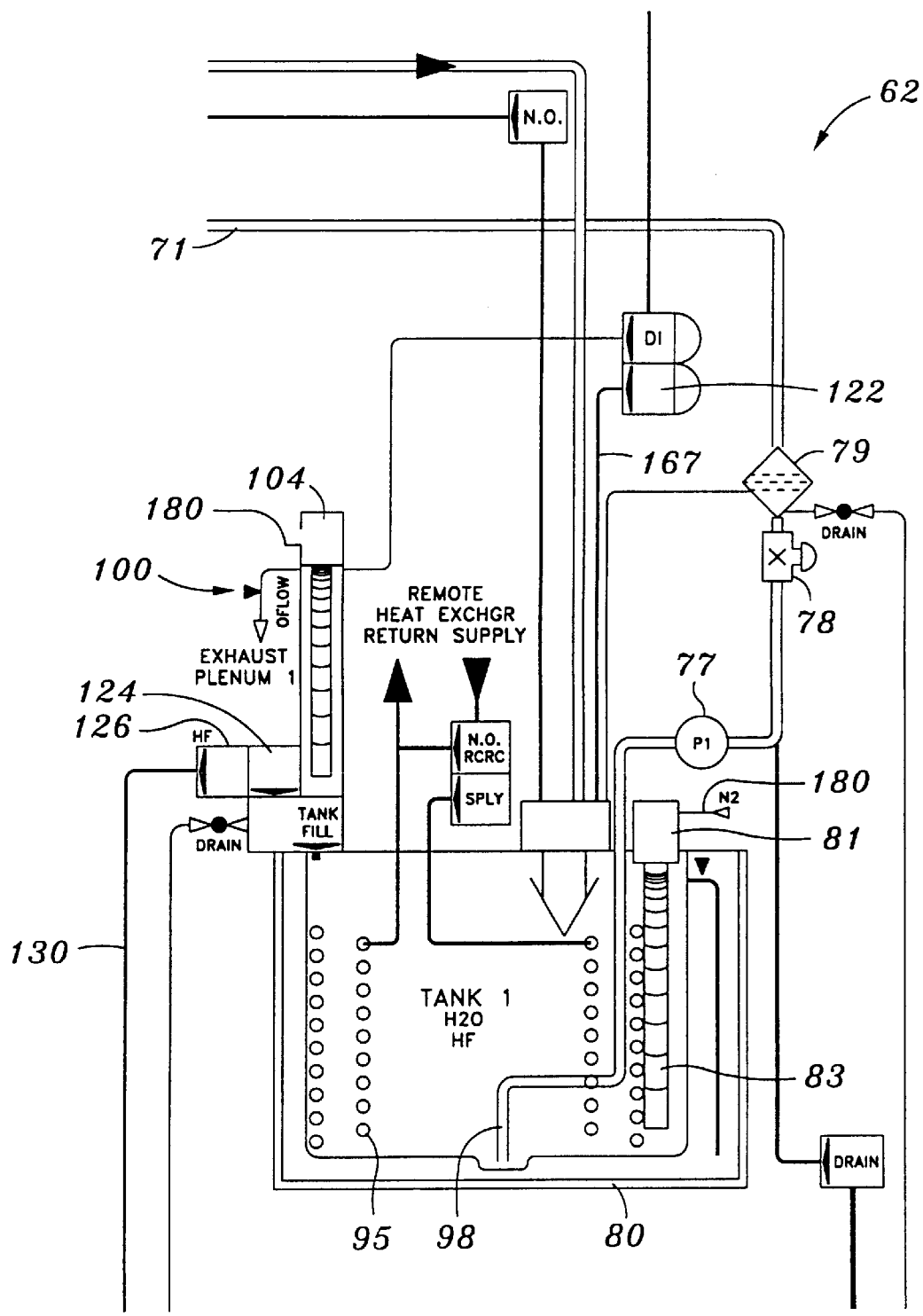
FIG. 16 is an enlarged schematic view of the first chemical system shown in FIG. 15.

Referring now to FIGS. 5, 6, and 15 the chemical solution systems 62, 64, 66, and 68 in the processor unit 32 are connected to one of the spray manifolds 48 on one of the processors 36 via manifold lines 71, 72, 73 and 74 leading into a distribution manifold 70, which in turn connects to the spray manifold 48 via a supply line 54. Additional supply lines 56 and 58 supply deionized water and drying gas to additional spray manifolds on the processors 36, as is well known in the field. The number and type of processors 36 and chemical solution systems will vary depending on the particular process to be performed, all within the scope of the invention.

Figure 7:
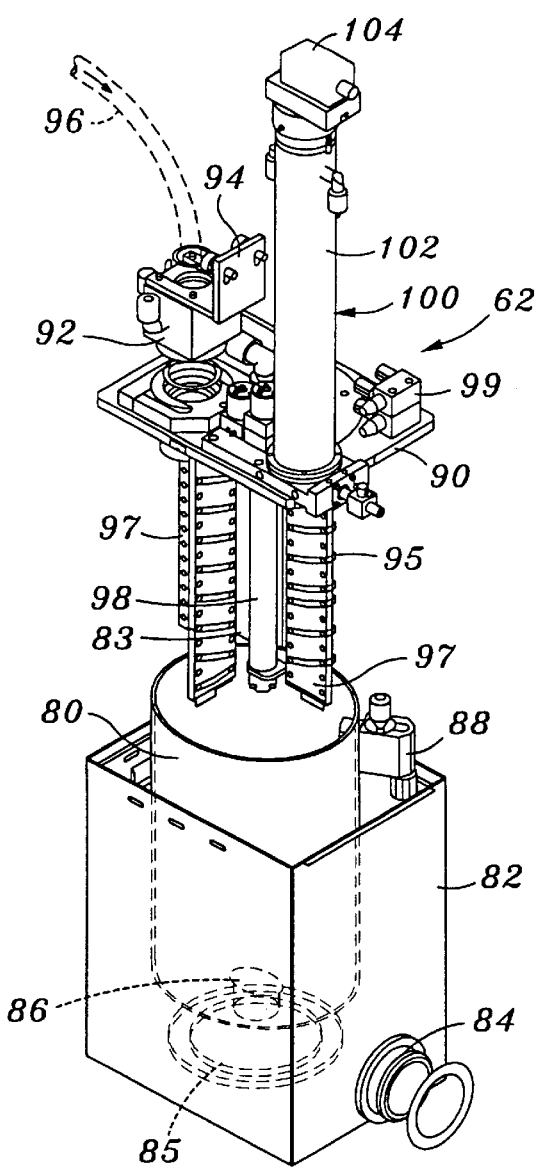
FIG. 7 is an exploded perspective view of a first chemical solution system.
Figure 8:
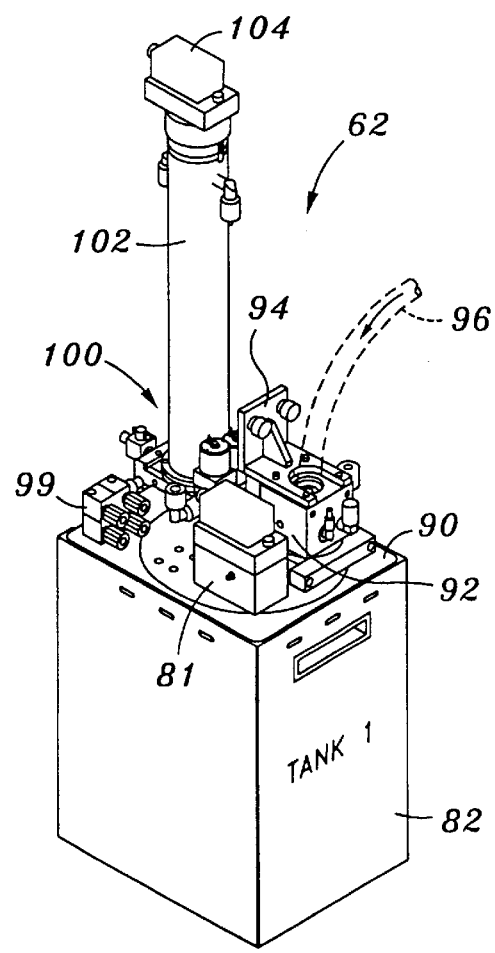
FIG. 8 is an assembled perspective view thereof.

Referring to FIGS. 7 and 8, the first chemical solution system 62, in the specific embodiment shown, handles the DHF chemical solution. The first chemical solution system 62 includes a process tank 80 having a sump 86 at the bottom. A tank support ring 85 supports the process tank 80 off of the bottom surface of a containment tank 82, to provide clearance for the downwardly extending sump 86. A drain 84 on the containment tank 82 connects to a waste tank 76 (shown in FIG. 15). A tank lid 90 closes off the top of the process tank 80 and the containment tank 82. A reclaim manifold 92 and a metering system 100 are supported on top of the tank lid 90. A U-shaped reclaim manifold bracket 94 holds the reclaim manifold 92 onto the tank lid, but also allows quick disconnect of the reclaim manifold 92 by sliding the bracket 94 to one side. For use with chemical solutions that must be chilled, such as DHF, cooling plates 97 extend downwardly from the tank lid 90 into the process tank 80. Cooling coils 95 extend around the cooling plates 97. A cooling medium, such as chilled water, is provided to the cooling coils 95 via fittings 99 on top of the tank lid 90. A suction or uptake tube 98 extends downwardly from the tank lid 90 between the plates 97.

Referring to FIG. 15, the uptake tube 98 connects to the manifold line 71 through a pump 77, a flow meter 78 and a filter 79. The uptake tube 98 extends downwardly into the sump 86 in the process tank 80, so that virtually all of the chemical solution can be removed from the process tank 80, to insure that each batch is not diluted from the previous batch.

A process tank liquid level sensor 81 is mounted over an opening on the tank lid 90, and detects the level of the chemical solution within the process tank 80. Preferably, the level sensor 81 is an ultrasonic sensor. The sensor 81 is aligned over a containment tank sensor tube 83 extending down to near the bottom of the containment tank. The tube 83 reduces disturbances to liquid level measurements due to waves in the tank 82.

Referring to FIGS. 7, 8 and 15, the fourth chemical solution system 68, which in the embodiment shown handles Piranha (a mixture of $H_2SO_4$, $H_2O_2$, and deionized (DI) water), is the same as the first chemical solution system 62 except that the cooling coils 95, plates 97 and fittings 99, are omitted, as no cooling is needed for the Piranha solution.

Figure 9:
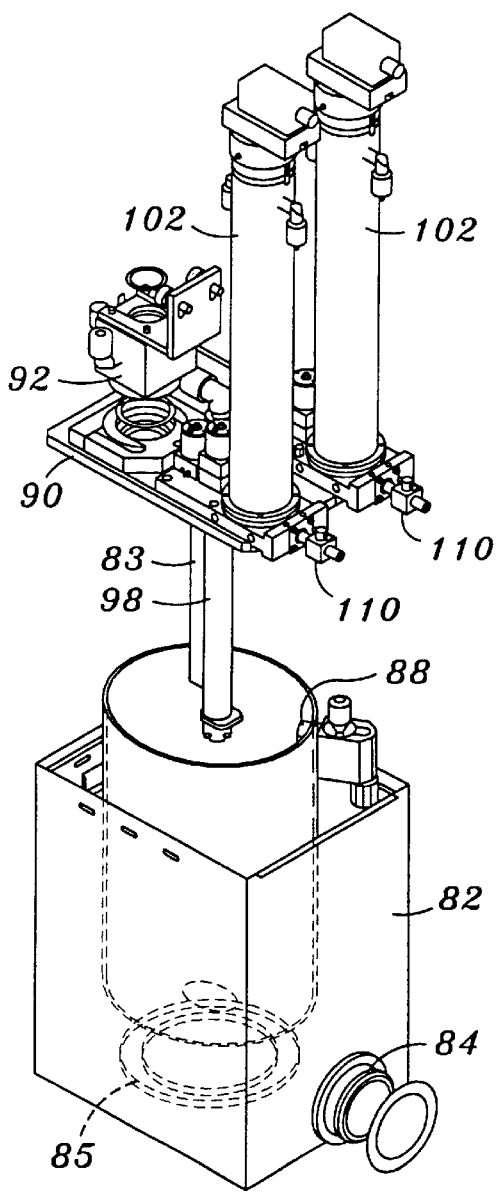
FIG. 9 is an exploded view of a second chemical solution system.
Figure 10:
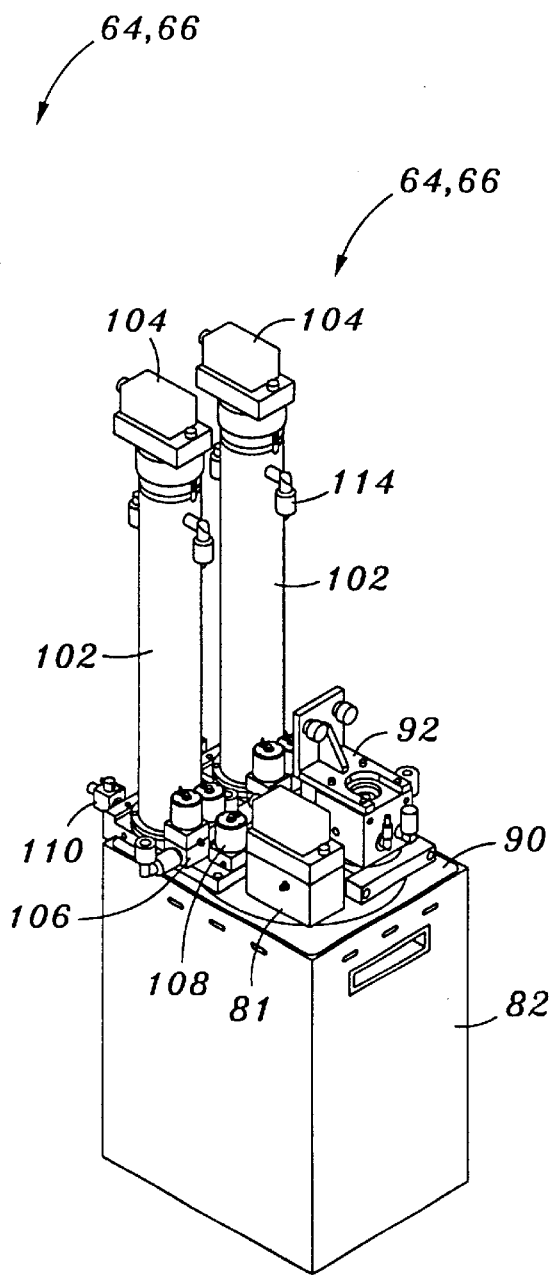
FIG. 10 is an assembled perspective view thereof.

FIGS. 9 and 10 show the second and third chemical solution systems 64 and 66, which handle the SC1 and SC2 chemical solution. These two chemical solution systems are identical to each other, and are the same as the first chemical solution system 62, as shown in FIGS. 7 and 8, except that the cooling coils 95, plates 97, and fittings 99 are omitted, as cooling is also not needed for the SC1 and SC2 chemical solutions. In addition, as the chemical solution systems 64 and 66 both require simultaneous metering of two chemical solutions (i.e., $H_2O_2$ and HCL in system 64, and $H_2O_2$ and $NH_4OH$ in system 66), these systems each have two metering systems. The remaining chemical solution component or ingredient in the second and third chemical solution systems 64 and 66 is DI water, which is bulk filled into the process tanks 80 and is not separately metered.

Figure 12:
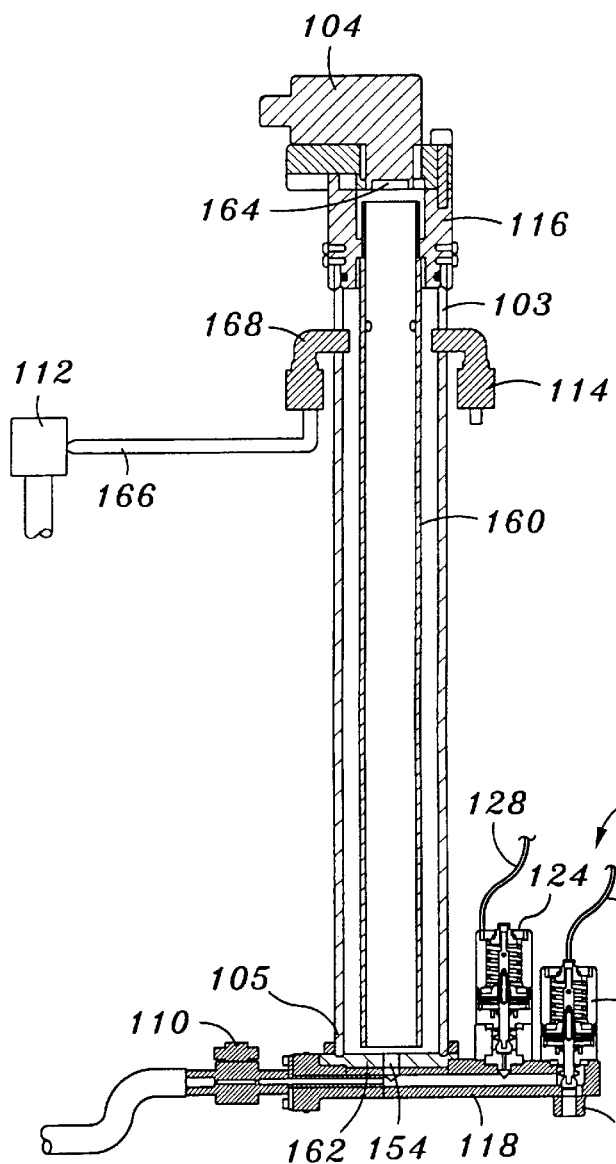
FIG. 12 is a section view of the chemical solution metering system shown in FIG. 11.
Figure 11:
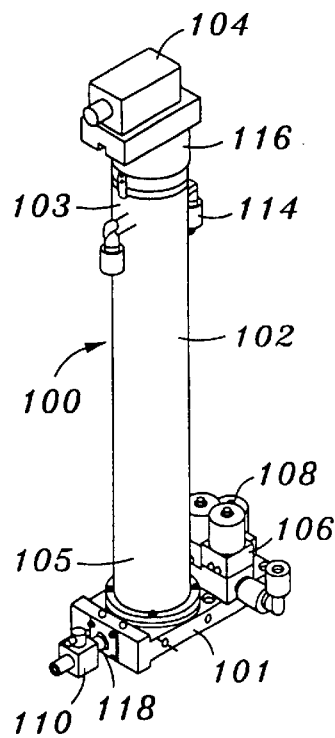
FIG. 11 is a perspective view of the metering system shown in FIGS. 7–10.

Turning to FIGS. 11 and 12, each metering system 100 has a hollow vertical cylindrical vessel 102 attached to a metering plate 101. A liquid level sensor 104, preferably an ultrasonic level sensor, is attached to a pop off lid 116 snapped onto the top end of 103 of the metering vessel 102. In the event the vessel becomes pressurized, the lid 116 can pop off.

Referring to FIG. 12, a sensor tube 160 engaged into the pop off lid 116 extends centrally downwardly through the metering vessel 102, to a position slightly above the bottom 162 of the metering vessel. The sensor tube 160 is aligned with the transducer 164 of the level sensor 104. An overflow sensor 114 extends through the cylindrical wall of the metering vessel at the top end 103 of the metering vessel 102. A DI supply line 166 also leads into the top end 103 of the metering vessel 102 via a fitting 168. A DI rinse valve 112 controls flow of DI water through the water line 166. An inlet/outlet opening 154 extends through the vessel bottom plate 162, and leads into an inflow/outflow pipe or duct 118 in the metering plate 101. The inflow/outflow pipe 118 terminates at one end in a manual drain valve 110, which can be used to manually drain the metering vessel 102. The other end of the inflow/outflow tube 118 extends into a single stage dispense valve 108. The dispense valve outlet 109 connects into the uptake tube 98, so that when the dispense valve 108 is opened, the liquid contents of the metering vessel 102 can run down into the process tank 80 via gravity.

The metering vessel 102, in the design shown, has a volume of 1,000 ml. The inside diameter of the metering vessel shown is 56 millimeters, and the length or height of the vessel 102 is about 840 millimeters.

The ratio of the vessel height to vessel diameter is preferably 5–10:1, so that a change in fluid volume within the vessel will result in a sufficiently large corresponding change in the level that the level sensor 104 will detect the change. In the embodiment shown, the sensor 104 can resolve fluid level changes as small as 2.5 millimeters, corresponding to a volume change of 6 ml. With a process tank volume of about 15 liters, the metering system 100 provides plus or minus 1% mixing accuracy. The level sensor 104 count is always less than 1% tolerance of the volume of any liquid chemical ingredient required for the chemical solution prepared in the process tank 80, whether it is bulk filled, or metered. As the metering system 100 does not use a metering pump, the accumulated error per pump stroke in volume is eliminated.

The process tank 80 is advantageously a molded PFA component. The containment tank 82 is preferably a fire retardant polypropylene. The tank lid is advantageously PTFE. As the tank lid 90 is the interface for all of the components associated with the process tank 80, the process tank can advantageously be manufactured as a one piece seamless tank.

Figure 13:
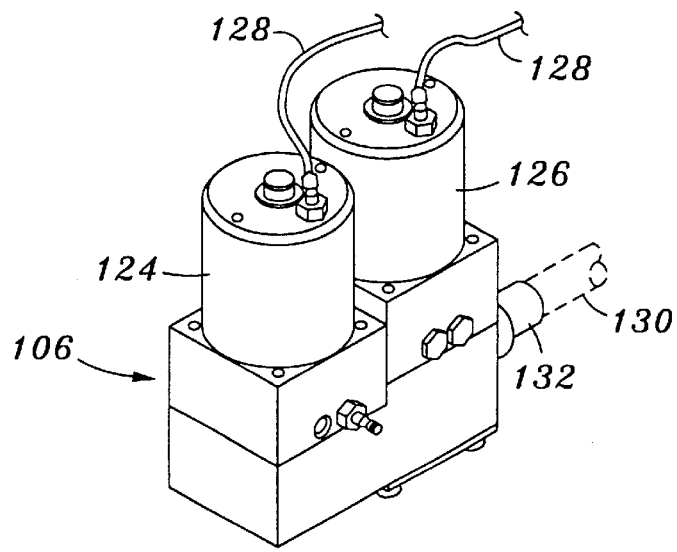
FIG. 13 is a perspective view of the two stage fill valve shown in FIGS. 11 and 12.
Figure 14:
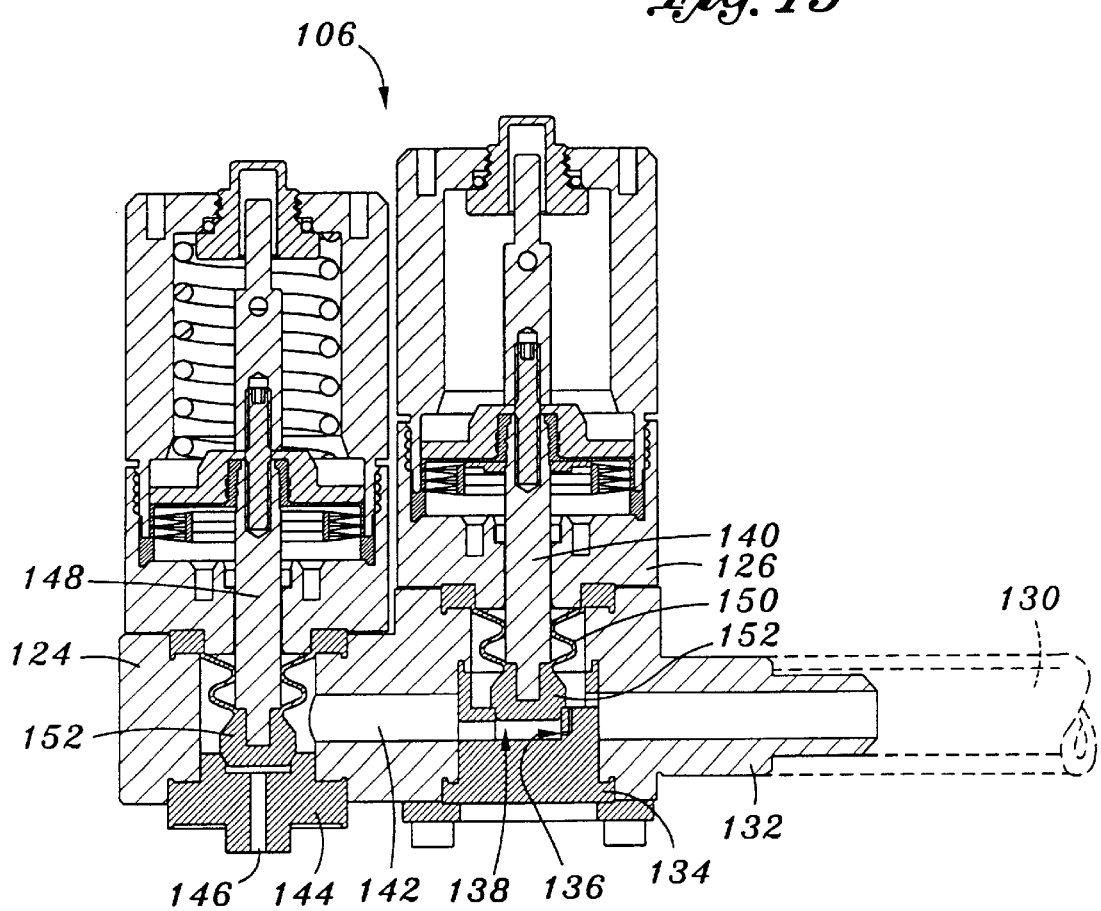
FIG. 14 is an enlarged section view thereof.

Referring to FIGS. 13 and 14, metering system 100 includes a two stage fill valve 106, which includes a fast fill valve 124 and a slow fill valve 126. A liquid chemical ingredient supply line 130, from a bulk source, connects to a valve inlet 132. A slow fill adapter 134 in the slow fill valve 126 has a primary orifice 138 which is opened or closed off by a resilient valve head 152 on a plunger 140. With the plunger 140 in the up or open position, the slow fill valve 126 is open, connecting the valve inlet 132 to a fast fill duct 142, via the primary orifice 138, allowing liquid to freely pass.

The slow fill adapter 134 also has a slow fill always open orifice 136, having a diameter much smaller than the diameter of the primary orifice 138. The slow fill orifice 136 bypasses the primary orifice 138, and allows fluid flow, regardless of the position of the plunger 140.

The fast fill valve 124 has a fast fill adapter 144 including a fast fill orifice 146. The fast fill orifice 146 has a diameter greater than the diameter of the slow fill orifice 136. In the embodiment shown, the fast fill orifice 146 has a diameter of about 2 millimeters, whereas the slow fill orifice has a diameter of about 0.5 millimeters. The fast fill valve 124 is normally closed, i.e., the fast fill plunger 148 is normally down, such that the head 152 seals against the fast fill adapter 144, closing off the fast fill orifice 146. The slow fill valve 126 is normally open.

The valves 124 and 126, as well as the other valves shown in the figures, may be electrically or pneumatically actuated. The valves are linked, directly or indirectly, and are controlled by, the system controller 120. The various liquid level sensors shown in the drawings are also linked to the system controller 120, as are the controls for the pumps, and the heating and cooling components and the inputs from the flow sensors.

In use, the chemical solution systems 62, 64 and 66 are provided with bulk fill DI water. (The system 68 does not use DI water in the chemical solution.) In the first chemical solution system 62, described here as an example, DI water is added to the process tank 80. The process tank level sensor 81 senses the level of DI water in the process tank 80, and provides level information to the system controller 120, which controls the DI water fill valve 122.

To prepare the chemical solution in the process tank 80 of the first chemical solution system 62, the liquid chemical ingredient is provided from a bulk source into the metering system 100 via the supply line 130, as shown in FIG. 15. Specifically, the liquid chemical ingredient (HF for the chemical solution system 62, in the embodiment shown) is delivered via the supply line 130 to the valve inlet 132 on the slow fill valve 126 of the two stage fill valve 106. The slow fill valve 126 is normally open, i.e., the slow fill plunger 140 is up, leaving the primary orifice 138 open, with the valve in a de-energized condition. Accordingly, the liquid chemical flows through the inlet 132, and through the primary orifice 138 and into the fast fill duct 142. A small amount of liquid may also flow through the always open slow fill orifice 136.

The fast fill valve 124, which is normally closed, is actuated to open, via the system controller 120. Referring to FIGS. 12 and 14, with both fill valves 124 and 126 open, the flow path from the inlet 132 to the fast fill orifice 146 is largely unobstructed. Accordingly, the liquid flows from the supply line 130, through the two stage fill valve 106, through the fast fill orifice 146, into the inflow/outflow tube 118, through the vessel inlet/outlet 154, and into the bottom end 105 of the metering vessel 102. The vessel 102 therefore fills from the bottom up.

As the vessel 102 fills, the level sensor 104 detects the liquid level within the vessel. When the vessel 102 is near full (e.g., 1000 ml) the system controller 120 which monitors the level information provided by the sensor 104, closes the slow fill valve 126. Specifically, the slow fill plunger 140 is actuated downwardly, sealing the head 152 against a seat formed in the slow fill adapter 134, closing off the primary orifice 138. However, fluid continues to flow through the much smaller always open slow fill orifice 136. As the slow fill orifice 136 is much smaller than the fast fill orifice 146, the flow rate through the valve 106 with the slow fill valve 126 closed is much slower. Accordingly, the vessel 102 continues to fill to the maximum desired volume, but at a much slower rate. When the system controller 120 determines that the vessel 102 is filled to the desired volume, via the output from the level sensor 104, the system controller 120 closes the fast fill valve 124, thereby stopping flow into the vessel. The liquid volume within the vessel 102 is then a precisely known value. For example, with a vessel volume of 1000 ml, and a vessel diameter/height ratio of 1:8, and sensor resolution of 2.5 mm, the volume within the vessel can be determined to plus or minus 6 ml, i.e., less than 1% error. The metering systems 100 can meter 800 ml in 35 seconds, significantly faster than prior designs.

To continue preparing the chemical solution mixture in the process tank 80, the system controller 120 actuates the single stage dispense valve 108. The liquid contents of the vessel 102 then flow via gravity out through the inlet/outlet 154, into the inflow/outflow 118, through the dispense valve 108 and outlet 109, and then into the process tank 80. The system controller 120 monitors the level outputs from the level sensors 104 and 81, to confirm that the volume of liquid in the metering vessel 102 has been fully delivered to the process tank 80. With the procedure described above, a very precise volume of liquid is therefore delivered into the process tank 80, with better than plus or minus 1% mixing accuracy. Accordingly, variations in the processing rate and processing uniformity of the wafers are significantly reduced, helping to improve the ultimate yield of semiconductor devices manufactured from the wafers.

The chemical solution in the process tank 80 of the first chemical solution system 62 is maintained at near room temperature, despite nearby heat sources, by circulating chilled water (from an external source) through the cooling coils 95. The system controller 120 monitors temperature of the solution within the process tank 80, and controls the valves 93 in the chilled water supply, to maintain the solution within a desired temperature range.

The other chemical solution systems 64, 66 and 68 operate in the same way as described above for the system 62. However, they do not involve any cooling. Rather, after the ingredients have been metered and delivered into the process tanks 80, they are drawn out by a pump 77, and passed through an inline heater 170, which is also monitored and controlled by the system controller 120, as shown in FIG. 15.

As the second and third chemical solution systems 64 and 66 measure two ingredients into the process tank 80, those systems have two metering systems 100, operating as described above in connection with the first system 62.

To process a batch of wafers in the chamber 38, the chemical solution is drawn out of the process tank via the pump 77, and is optionally heated, depending on the chemical solution used. The chemical solution then flows through a manifold line 71, 72, 73 or 74 into the distribution manifold 70. Valves in the manifold 70 controlled by the system controller 120 determine whether a chemical solution will be delivered to the chamber 38 via the supply tube 54, or whether the chemical solution will be recirculated back into the process tank 80, as is well known in the field.

In performing a four-chemical clean process, the process times for Piranha, DHF, SC1, and SC2 are 8, 4½, 6½, and 5 minutes, respectively. For the chamber 38 to have 100% up time, all of the tanks 80 must be replenished, within a minimum time which is the sum of the three shortest process times, i.e., 16 minutes. In the design described above, the measured times (in minutes and seconds) are:

time to drain the process tank 80=0:50.
time to bulk fill=1:20;
time to meter (a maximum volume of 2211 ml)=2:00; and
maximum time to heat (SC1 and SC2 to 70° C.)=10:00 minutes.

The total time to replenish is therefore about 14½ minutes. As this is less than 16 minutes, the system 60 can provide 100% up time.

The chemical supply system 60 incorporating the four chemical solution systems 62, 64, 66 and 68, is designed to be easily serviced, for routine maintenance, inspection, repair or change over. As all of the metering and inlet/outlet components are attached to the tank lid 90, the process tank 80 and the containment tank 82 can be removed without detaching fluid couplings. Only the connection from the containment overflow sensor 88 to the system controller 120 needs to be disconnected. To perform maintenance on either the metering system 100 or the process tank 80, the manual drain valve 110 is opened to drain any liquid out of the metering vessel 102. The normally closed DI water rinse valve 112 is then opened, to fill the metering vessel 102 with DI water. The drain valve 110 can then be used to drain the DI water out of the metering vessel and into a waste tank. Alternatively, the dispense valve 108 can be opened, to dispense the DI rinse water from the metering vessel 102 into the process tank 80.

The system controller 120 controls the pumps and valves shown in FIG. 15, to supply the chemical solutions from the four chemical solutions systems 62, 64, 66 and 68, in a desired sequence, and for desired durations, as is well understood in the field.

Referring to FIGS. 8 and 15, a reclaim line 96, a DI water line 167, a bleed line 169, and optionally a bulk liquid chemical fill line, all connect into the reclaim manifold 92 on the tank lid 90. The reclaim manifold 92 can be removed from the tank lid 90 via sliding the reclaim manifold bracket 94. This allows the tank lid 90 and the components attached to it to be removed from the chemical supply system 60, without the need to separately detach the three or four lines running into the reclaim manifold 92.

Referring once again to FIG. 15, the chemical solutions in systems 64, 66 and 68 must be heated to e.g., 70° C. before they are sprayed onto the wafers. The line heater 170 has a temperature sensor 172 at the outlet of an infrared bulb quartz tube heater. As the temperature sensor 172 is at the outlet of the heater 170, the heater 170 operates in a proactive mode, in the sense that it is the point of use control with respect to the temperature of the chemical solution delivered to the wafers in the chamber 38. In contrast, in the past, temperature measurement and control has been performed in a process tank, which is more of a reactive mode, since the heater is reacting to a temperature drop of the chemical solution downstream of the wafers.

In operation, the system controller 120 operates the heater 170 to begin heating the chemical solution. The pump 77 is turned on to flow chemical solution through the heater 170. The distribution manifold 70 is switched to place the flow of chemical solution into a recirculation mode, so that the chemical solution is not delivered to the chamber 38, but rather recirculates back into the tank, through the reclaim line 96. The heater 170 continues to heat until a set point temperature of the chemical solution is measured by the temperature sensor 172. The initial heat up period is then completed. When the system controller 120 determines that chemical solution is to be delivered to the chamber 38; the system controller 120 determines the power and duty cycle applied to the heater 170 to maintain the temperature set point, within a selected tolerance.

As the volumes of the process tanks 80 are much smaller than in other semiconductor processing equipment used in the past, a significant reduction in chemical solution consumption is realized. In addition, the length of the lines interconnecting the various fluid components is minimized, allowing the semiconductor processing system 30 to perform the same processes as in the past, but within a smaller space.

Thus, a novel semiconductor processing system has been shown and described. Many changes and modifications can of course be made without departing from the spirit and scope of the invention. The invention, therefore, should not be limited, except by the following claims, and their equivalence.

What is claimed is:

1. A method for supplying fluids to a process chamber, comprising the steps of:

supplying fluid at a first flow rate into a lower end of a metering vessel;

detecting a level of the fluid in the metering vessel;

supplying fluid at a second flow rate into the lower end of the metering vessel, after a first predetermined level of fluid in the vessel has been detected, with the second rate less than the first rate;

closing off fluid supply to the metering vessel when a second predetermined level of fluid is detected in the vessel;

releasing the fluid from the metering vessel and allowing the fluid to flow into a tank; and transferring fluid from the tank and spraying the fluid onto one or more workpieces in a process chamber, to process the workpieces.

2. The method of claim 1 further comprising the step of detecting a level of a fluid in the tank.

3. The method of claim 1 further comprising the step of, heating the fluid.

4. The method of claim 1 further comprising the step of rotating the workpieces in the chamber, while spraying the fluid onto the workpieces.

5. A method of supplying a fluid to a process chamber, comprising the steps of:

supplying fluid at a first flow rate into a metering vessel;

detecting a level of the fluid in the metering vessel with a level sensor;

supplying fluid at a second flow rate into the metering vessel after a first predetermined level of fluid in the metering vessel has been detected by the level sensor, with the second flow rate lower than the first flow rate;

closing off fluid supply to the metering vessel when a second predetermined level of fluid is detected in the metering vessel by the level sensor;

releasing the fluid from the metering vessel into a tank; and transferring fluid from the tank and spraying the fluid onto one or more workpieces in a process chamber, to process the workpieces.

6. The method of claim 5 wherein the fluid is supplied into the metering vessel through a bottom of the metering vessel.

7. The method of claim 5 wherein the fluid flows into the tank via gravity when the fluid is released from the metering vessel.

8. The method of claim 5 further comprising the step of heating the fluid.

9. A method of supplying a fluid to a process chamber, comprising the steps of:

supplying fluid at a first flow rate into a metering vessel;

detecting continuously a level of the fluid in the metering vessel with a level sensor;

identifying when the fluid reaches a first predetermined level in the metering vessel;

closing a first valve when the fluid reaches the first predetermined level in the metering vessel, such that fluid continues to flow into the metering vessel at a second flow rate that is lower than the first flow rate;

identifying when the fluid reaches a second predetermined level in the metering vessel; and closing a second valve when the fluid reaches the second predetermined level in the metering vessel, such that fluid no longer flows into the metering vessel;

releasing the fluid from the metering vessel into a tank; and transferring fluid from the tank and spraying the fluid onto one or more workpieces in the process chamber, to process the workpieces.

10. The method of claim 9 wherein the fluid is supplied into the metering vessel through a bottom of the metering vessel.

11. The method of claim 9 wherein the fluid flows into the tank via gravity when the fluid is released from the metering vessel.

12. The method of claim 9 further comprising the step of heating the fluid.

13. A method of supplying fluids to a process chamber, comprising the steps of:

supplying fluid at a first flow rate into a lower end of a metering vessel until the fluid reaches a first predetermined level in the metering vessel;

supplying fluid at a second flow rate into the lower end of the metering vessel, with the second flow rate lower than the first flow rate;

closing off fluid supply to the metering vessel when the fluid reaches a second predetermined level in the metering vessel;

releasing the fluid from the metering vessel into a tank;

delivering fluid from the tank into a heater;

heating the fluid in the heater;

measuring a temperature of the fluid;

discontinuing heating of the fluid when the fluid has reached a predetermined set point temperature;

maintaining the fluid at the set point temperature in the heater; and spraying the fluid at the set point temperature into a process chamber.

14. The method of claim 13 wherein the fluid flows into the tank via gravity when the fluid is released from the metering vessel.

15. A method for supplying fluids to a process chamber, comprising the steps of:

supplying a first fluid into a lower end of a first metering vessel;

detecting a level of the first fluid in the first metering vessel;

reducing the flow rate of the first fluid into the lower end of the first metering vessel, after a first predetermined level of the first fluid has been detected in the first metering vessel;

closing off fluid supply to the first metering vessel when a second predetermined level of the first fluid is detected in the first metering vessel;

releasing the first fluid from the first metering vessel and allowing the first fluid to flow into a first tank;

delivering the first fluid from the first tank into the process chamber;

supplying a second fluid into a lower end of a second metering vessel;

detecting a level of the second fluid in the second metering vessel;

reducing the flow rate of the second fluid rate into the lower end of the second metering vessel, after a first predetermined level of the second fluid has been detected in the second metering vessel;

closing off fluid supply to the second metering vessel when a second predetermined level of the second fluid is detected in the second metering vessel;

releasing the second fluid from the second metering vessel and allowing the second fluid to flow into a second tank; and delivering the second fluid from the second tank into the process chamber.

16. A method for supplying fluids to a process chamber, comprising the steps of:

supplying fluid at a first flow rate into a lower end of a metering vessel;

detecting a level of the fluid in the metering vessel;

supplying fluid at a second flow rate into the lower end of the metering vessel, after a first predetermined level of fluid in the vessel has been detected, with the second rate less than the first rate;

closing off fluid supply to the metering vessel when a second predetermined level of fluid is detected in the vessel;

releasing the fluid from the metering vessel and allowing the fluid to flow into a tank; and wherein the fluid comprises a member selected from the group consisting of water, Piranha, DHF, SC1 and SC2.

* * * * *